(12) United States Patent
Ku (10) Patent No.: US 8,773,868 B2
(45) Date of Patent: Jul. 8, 2014

(54) HOLDER FOR ADD-ON CARD AND CIRCUIT BOARD ASSEMBLY

(75) Inventor: Hao-Cheng Ku, New Taipei (TW)

(73) Assignee: Wistron Corporation, Taipei (TW)

( * ) Notice: Subject to any disclaimer, the term of this patent is extended or adjusted under 35 U.S.C. 154(b) by 305 days.

(21) Appl. No.: 13/453,864

(22) Filed: Apr. 23, 2012

(65) Prior Publication Data

US 2013/0128478 A1 May 23, 2013

(30) Foreign Application Priority Data

Nov. 21, 2011 (TW) .............................. 100142617 A (51) Int. Cl.
*H05K 7/02* (2006.01)
*H05K 7/04* (2006.01)

(52) U.S. Cl.
USPC ............................................ 361/810; 361/753

(58) Field of Classification Search
USPC ......... 361/720, 725, 728–730, 747, 753, 759, 361/760, 801–802, 807, 809–810; 174/520; 248/224.61, 225.11, 694; 439/326, 439/328, 329, 331
See application file for complete search history.

(56) References Cited

U.S. PATENT DOCUMENTS

| | | | |
|---|---|---|---|
| 5,590,023 A * | 12/1996 | Hernandez et al. ........ | 361/679.6 |
| 6,185,093 B1 * | 2/2001 | Moss .......................... | 361/679.6 |
| 8,050,052 B2 * | 11/2011 | Zheng et al. .................. | 361/802 |
| 8,201,366 B2 * | 6/2012 | Sprague ...................... | 52/204.62 |
| 8,223,502 B2 * | 7/2012 | Shen et al. .................... | 361/748 |
| 2009/0016014 A1 | 1/2009 | Tu | |
| 2010/0027230 A1 * | 2/2010 | Wu et al. ....................... | 361/801 |

FOREIGN PATENT DOCUMENTS

| | | |
|---|---|---|
| TW | 576566 B | 2/2004 |
| TW | 595747 U | 6/2004 |
| TW | M312051 B | 5/2007 |
| TW | I329485 B | 1/2009 |

* cited by examiner

*Primary Examiner* — Hung S Bui
(74) *Attorney, Agent, or Firm* — Muncy, Geissler, Olds & Lowe, P.C.

(57) ABSTRACT

A holder includes a main-body disposed on a main circuit-board, a moving-arm, a fixed metal piece, and a moving metal piece. A support portion protrudes from a front side of the main-body and provides a supporting surface. The moving-arm includes a support block and an extension block. The support block is disposed to the front side, and an upper edge of the support block and the supporting surface are arranged in the same plane. The moving-arm moves to make the extension block protrude from the main-body. The fixed metal piece extends to a location between the support block and the front side. A part of the moving metal piece is located between the supporting block and the front side, while the other part extends to the extension block, so that at the moving metal piece is partially exposed corresponding to the front side.

15 Claims, 9 Drawing Sheets

HOLDER FOR ADD-ON CARD AND CIRCUIT BOARD ASSEMBLY

CROSS-REFERENCES TO RELATED APPLICATIONS

This non-provisional application claims priority under 35 U.S.C. §119(a) on Patent Application No. 100142617 filed in Taiwan, R.O.C. on 2011 Nov. 21, the entire contents of which are hereby incorporated by reference.

BACKGROUND OF THE INVENTION

1. Technical Field

This disclosure relates to mounting of an add-on card, and more particularly, to a holder for an add-on card and a circuit board assembly having the holder.

2. Related Art

Different from standard desktop computers, in many thin computer hosts (for example, a blade server having a height of 1 U), an add-on card is generally mounted by configuring the add-on card in parallel with a motherboard, so as to solve the problem that the case has small internal space and insufficient height. The parallel configuration is disclosed in, for example, Taiwan (R. O. C.) Invention Patent No. I329485, and in I329485 an add-on card and a motherboard are connected through an adapter circuit board, so that the add-on card is configured in parallel with the main board.

However, the add-on card disposed transversely always lacks support on a front edge thereof, so that the add-on card may be affected by the gravity and shock of external forces and swings towards the main board like a cantilever beam. For example, Taiwan (R. O. C.) Utility Model No. 595747 proposed a support structure, which is used to support a front edge of an add-on card, thereby preventing the add-on card from swinging. However, the support member in No. 595747 is a part of a computer case, and therefore, a specification and location of the add-on card are both limited. Furthermore, for a custom-made add-on card, in addition to grounding circuit provided by original connection interfaces, an additional grounding solution is always required to improve the grounding effect. In order to solve these problems, a support member having a grounding function is disposed on a main board, so as to support a front edge of an add-on card and provide additional grounding circuit. However, in a thin computer host various interface slots are always configured on a circuit board densely. Add-on cards located on the interface slots do not interfere with insertion operation of low-profile electronic cards, but the configuration of the support member may interfere with the interface slots, so that only one of the support member and the interface slots can be configured.

SUMMARY

In the prior art, the configuration of a support member sometimes interferes with the configuration of interface slots. Accordingly, this disclosure is directed to a holder for an add-on card and a circuit board assembly, so as to solve the problem of mutual interference between the support member and the interface slots.

This disclosure provides a holder for supporting an add-on card on a main circuit board and electrically grounding the add-on card. A grounding element is disposed at an edge of the add-on card. The holder includes a main-body, a moving-arm, a fixed metal piece, and a moving metal piece.

The main-body is disposed on the main circuit board. The main-body includes a front side, a rear side, and a top side. A support portion protrudes from the front side, and the support portion provides a supporting surface for supporting the edge of the add-on card.

The moving-arm includes a support block and an extension block. The extension block is connected to the support block. The support block is disposed to the front side of the main-body in a movable manner, and an upper edge of the support block and the supporting surface are arranged in the same plane for supporting the edge of the add-on card. The moving-arm moves to make the extension block protrude from the main-body with a gap existing between the extension block and the main circuit-board.

The fixed metal piece is disposed on the main-body and is electrically grounded, and a part of the fixed metal piece extends to a location between the support block and the front side.

A part of the moving metal piece is disposed on the support block, and is located between the support block and the front side for contacting with the fixed metal piece. The other part of the moving metal piece extends to the extension block, so that at least a part of the moving metal piece is exposed corresponding to the front side.

This disclosure further provides a circuit board assembly, which includes a main circuit board, an interface slot, a main-body, a moving-arm, a fixed metal piece, and a moving metal piece.

The interface slot is disposed on the main circuit board. The main-body is disposed on the main circuit board. The main-body includes a front side, a rear side, and a top side. A support portion protrudes from the front side, and the support portion provides a supporting surface.

The moving-arm includes a support block and an extension block. The extension block is connected to the support block. The support block is disposed to the front side of the main-body in a movable manner, and an upper edge of the support block and the supporting surface are arranged in the same plane. The moving-arm moves to make the extension block protrude from the main-body and be located above the interface slot.

The fixed metal piece is disposed on the main-body and is electrically grounded. A part of the fixed metal piece extends to a location between the support block and the front side.

A part of the moving metal piece is disposed on the support block, and is located between the support block and the front side for contacting with the fixed metal piece. The other part of the moving metal piece extends to the extension block, so that at least a part of the moving metal piece is exposed corresponding to the front side.

According to technical solutions provided in this disclosure, a gap exists between the extension block of the moving-arm and the main circuit board, so that a part of the interface slot may be disposed between the extension block and the main circuit board, thereby preventing the holder from interfering with the interface slot. At the same time, the movable moving-arm may also be matched with add-on cards of different widths, so that the holder has a preferred compatibility.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
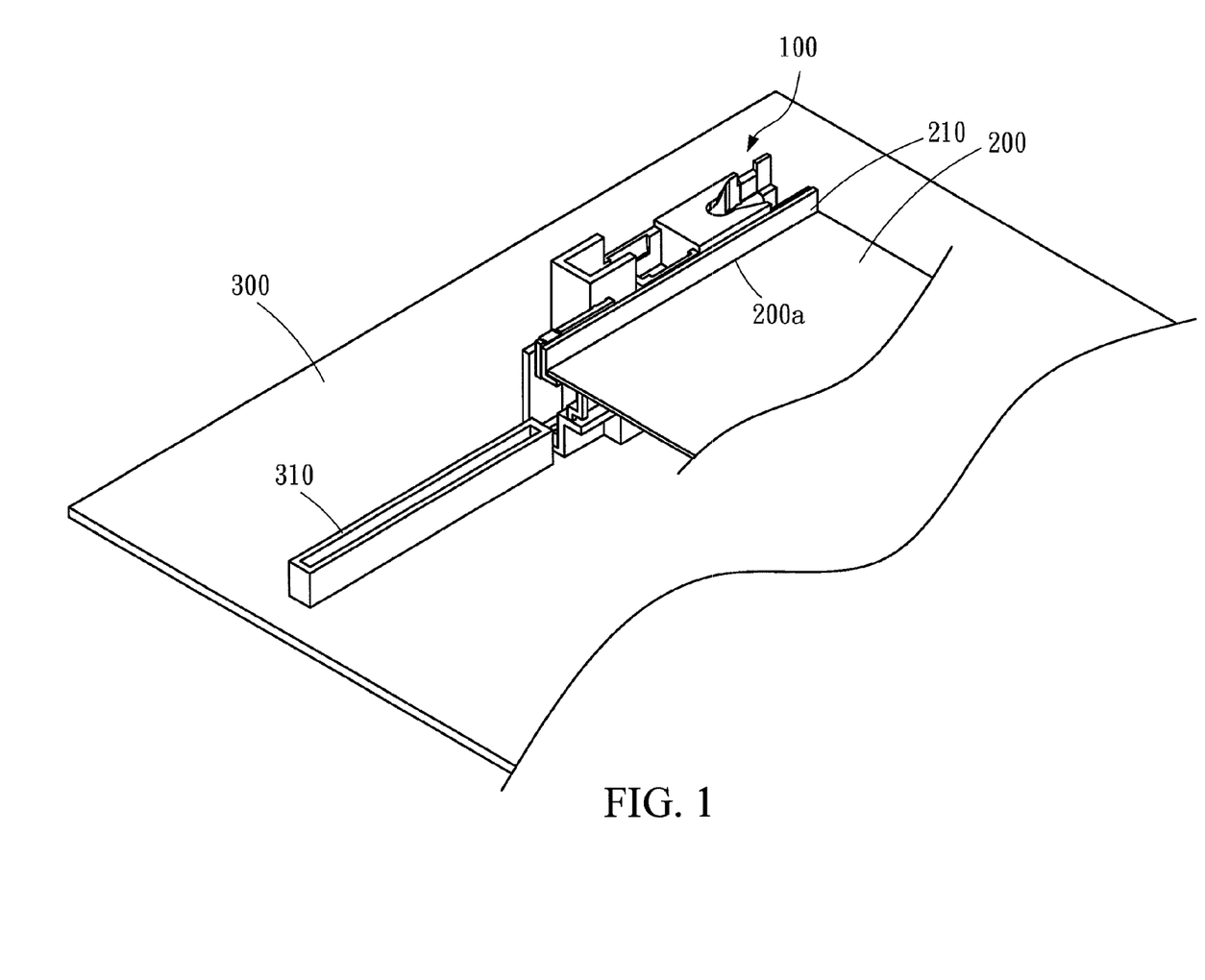
FIG. 1 is a three-dimensional view of a circuit board assembly according to an embodiment.

Please refer to FIG. 1, in which a circuit board assembly according to an embodiment of is shown. The circuit board assembly includes a main circuit board 300, and an interface slot 310. A holder 100 and the interface slot 310 are disposed on the main circuit board 300. The holder 100 is used for supporting an add-on card 200 on the main circuit board 300, and electrically grounding the add-on card 200. A grounding element 210 is disposed at an edge 200a of the add-on card 200.

Figure 2:
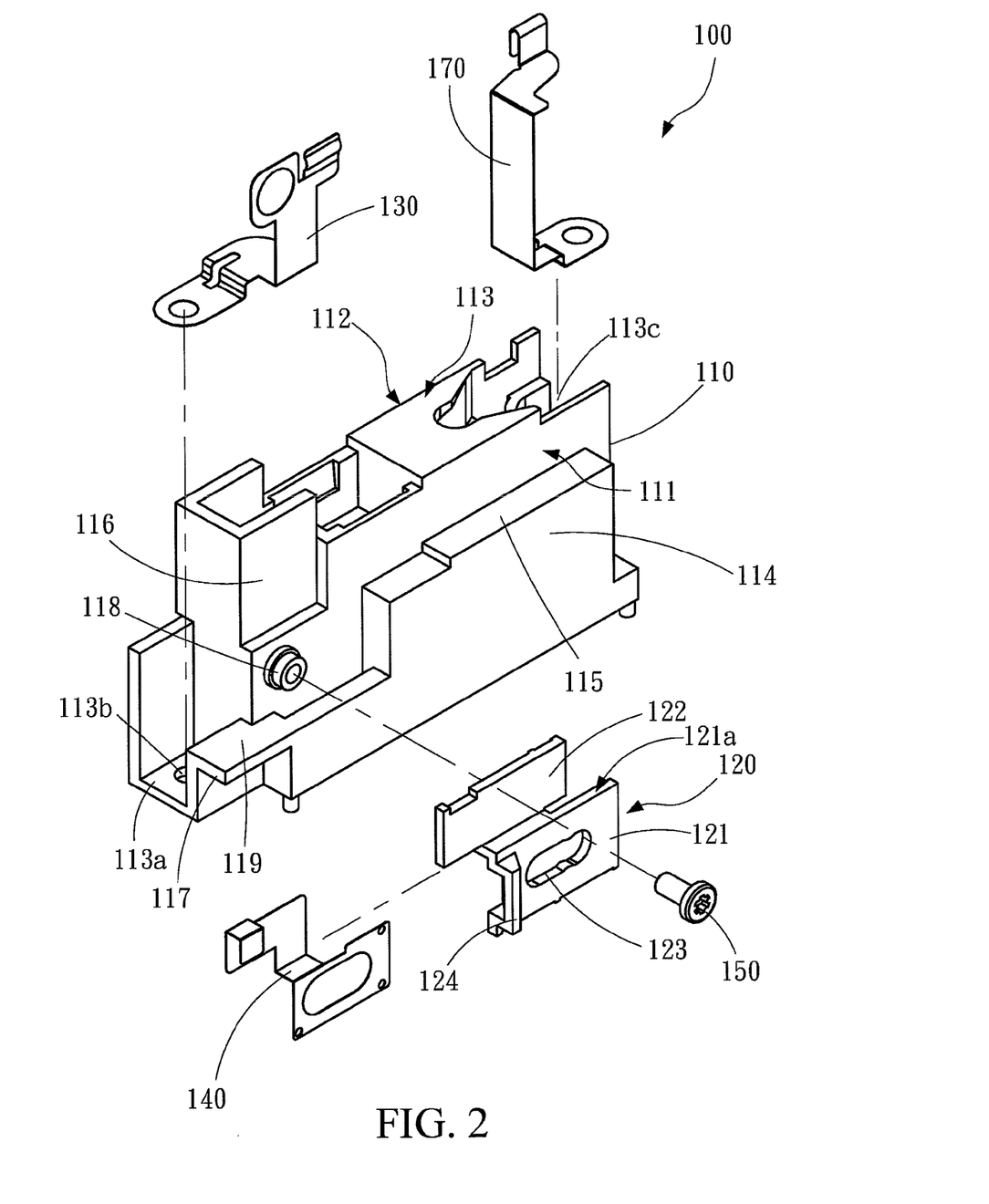
FIG. 2 is an exploded view of a holder according to the embodiment.
Figure 3:
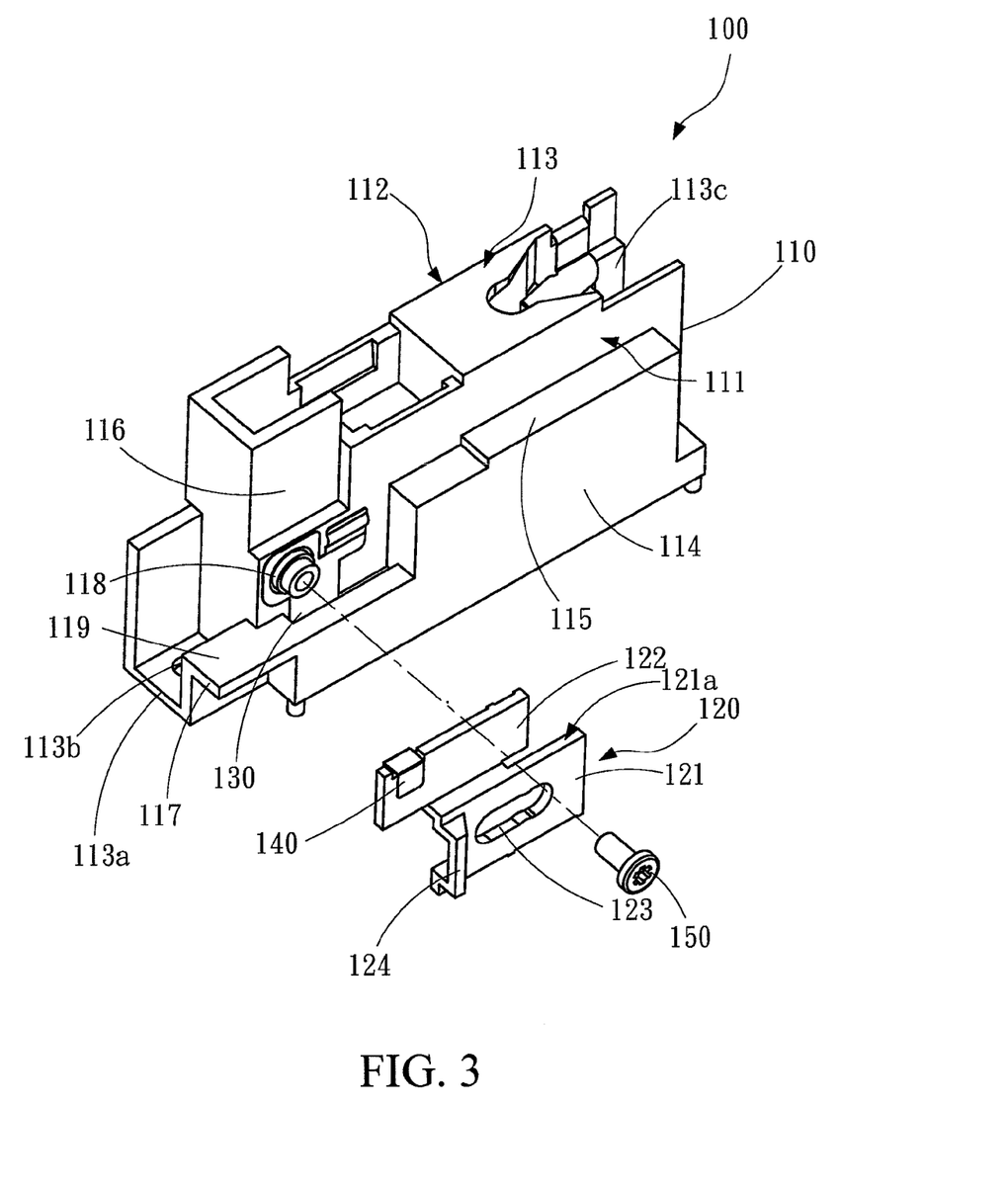
FIG. 3 is an exploded view of some elements of the holder according to the embodiment.
Figure 4:
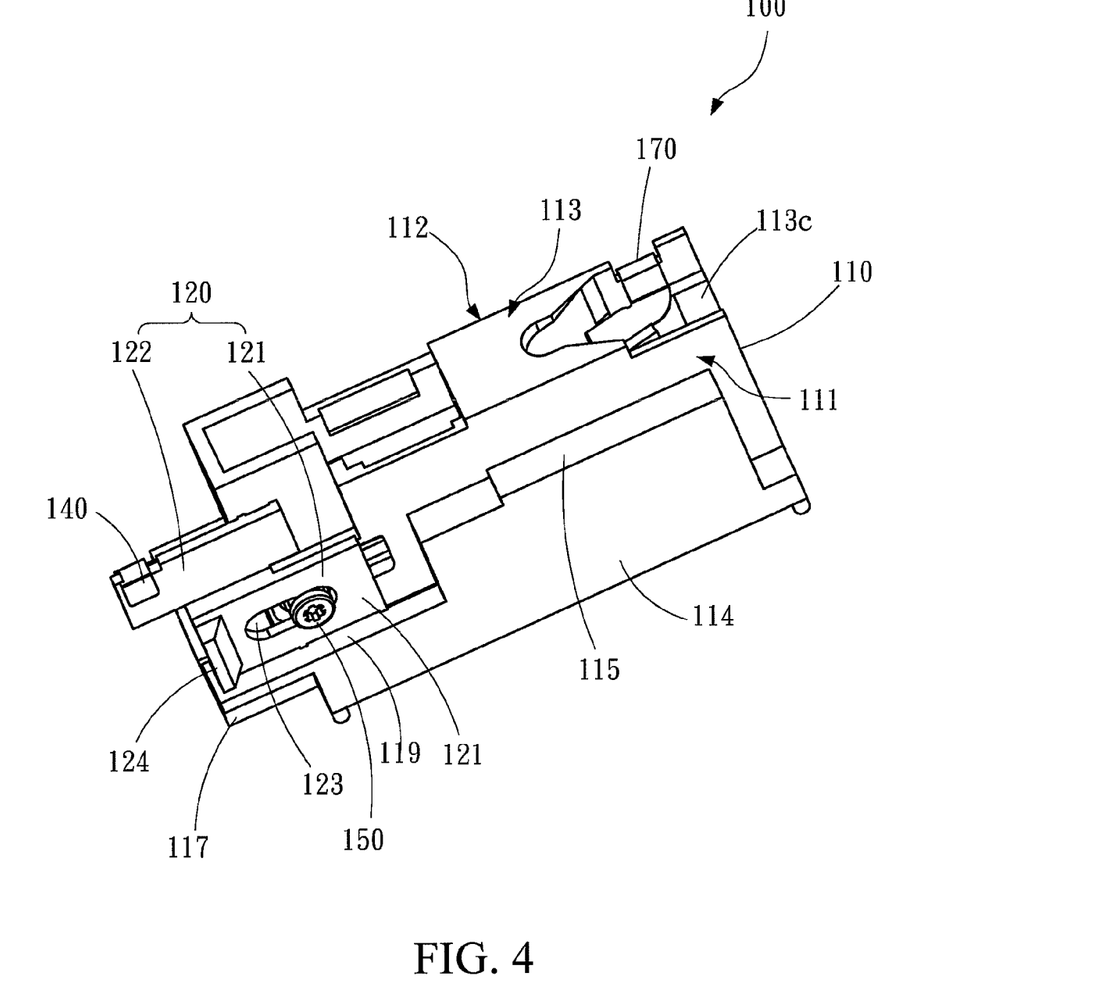
FIG. 4 and FIG. 5 are three-dimensional views of the holder according to the embodiment.
Figure 5:
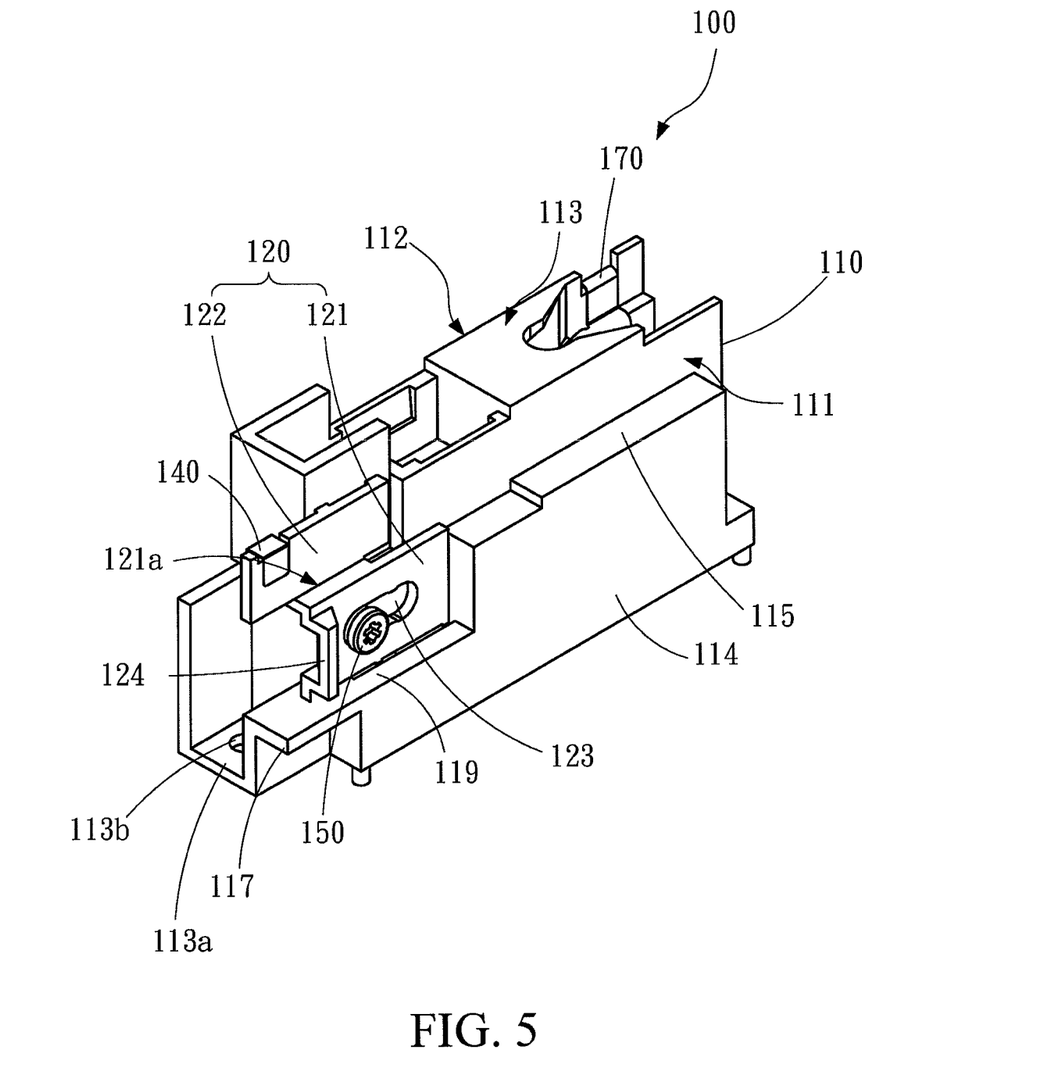

As shown in FIG. 2, FIG. 3 and FIG. 4, the holder 100 includes a main-body 110, a moving-arm 120, a fixed metal piece 130, and a moving metal piece 140.

As shown in FIG. 2, FIG. 3 and FIG. 4, the main-body 110 is disposed on the main circuit board 300, and is close to an end of the interface slot 310. The main-body 110 includes a front side 111, a rear side 112, and a top side 113. A support portion 114 protrudes from the front side 111, and the support portion 114 provides a supporting surface 115. The supporting surface 115 and the top side 113 face the same direction, and the height of the supporting surface 115 is lower than that of the height of the top side 113.

As shown in FIG. 2, FIG. 3, FIG. 4 and FIG. 5, the moving-arm 120 includes a support block 121 and an extension block 122. The extension block 122 is connected to the support block 121. The support block 121 is disposed to the front surface 111 of the main-body 110 in a movable manner, and an upper edge 121a of the support block 121 is located in the same plane with the supporting surface 115. Located in the same plane, the upper edge 121a of the support block 121 and the supporting surface 115 supports the edge 200a of the add-on card 200.

As shown in FIG. 4, FIG. 5, FIG. 6 and FIG. 7, the moving-arm 120 moves between a supporting position S away from the support portion 114 and a receiving position R near the support portion 114.

Figure 6:
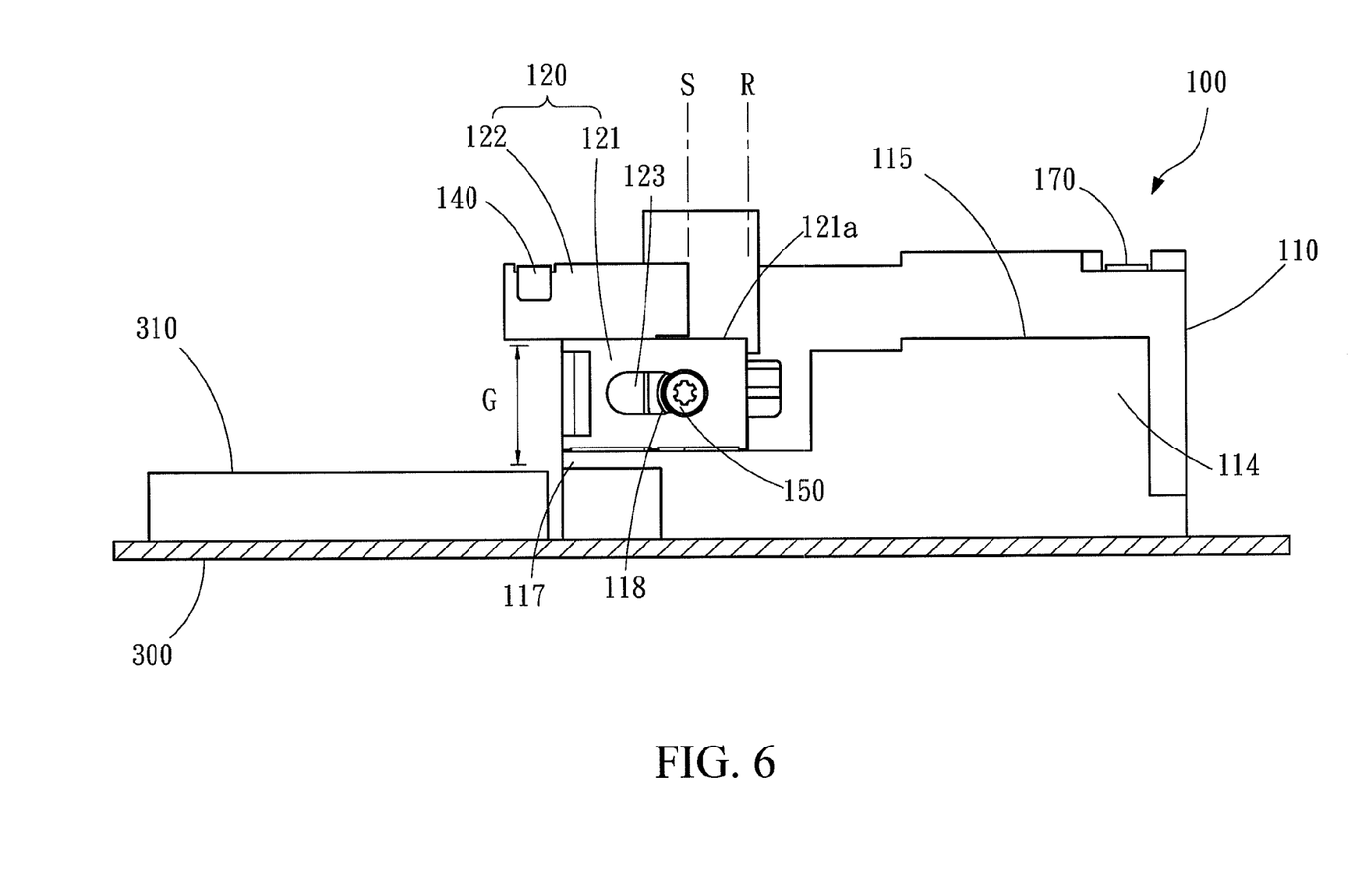
FIG. 6 and FIG. 7 are side views of the holder, the main circuit board, and the interface slot according to the embodiment.
Figure 7:
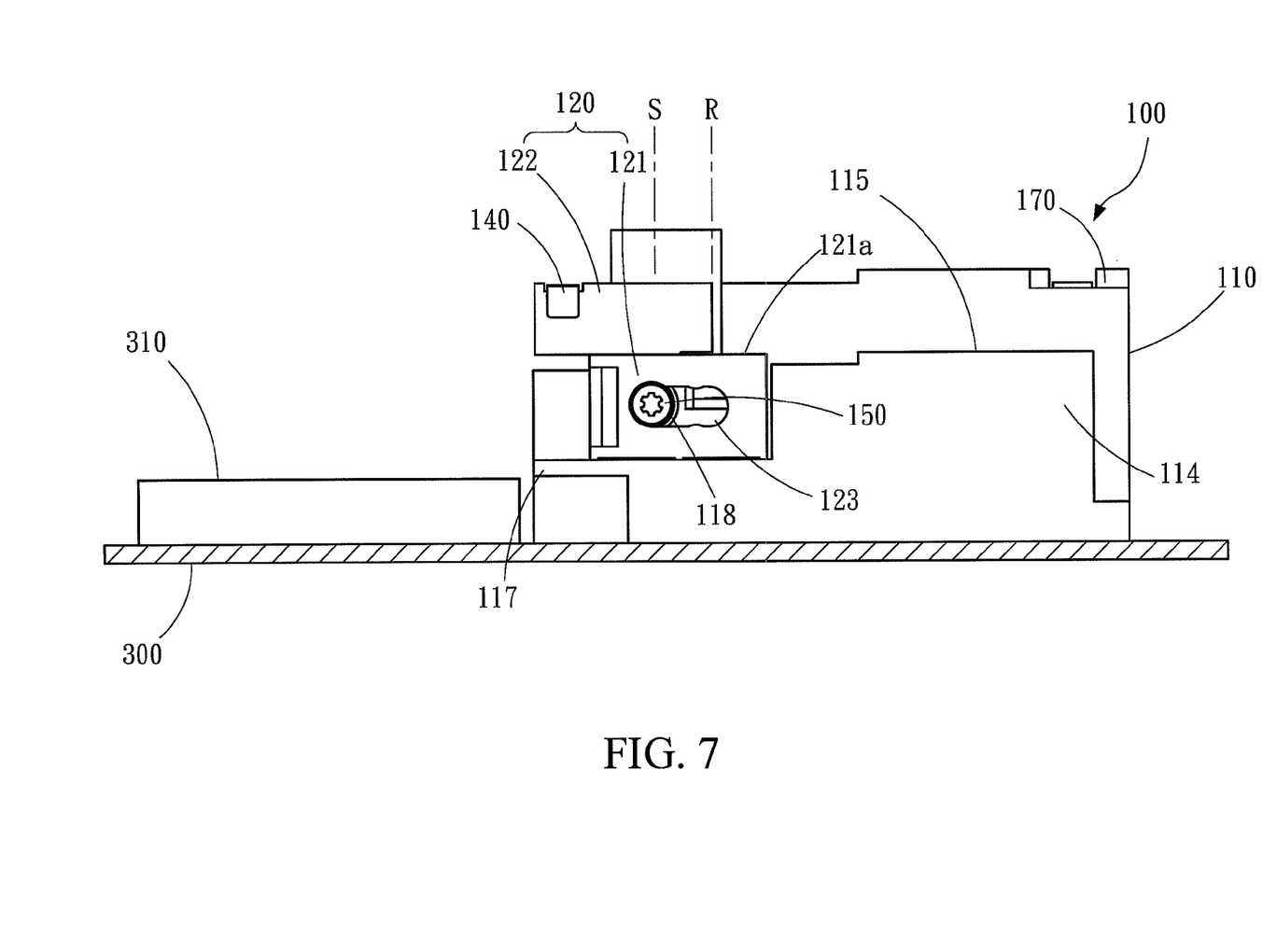

As shown in FIG. 6 and FIG. 7, when the moving-arm 120 is located at the supporting position S, the extension block 122 protrudes from the main-body 110. At the same time, a gap G exists between the extension block 122 and the main circuit board 300, so that the extension block 122 is located on one end of the interface slot 310.

As shown in FIG. 2 and FIG. 3, in a specific example, the support block 121 and the extension block 122 are respectively sheet bodies, and are located in parallel with each other without being located in the same plane. The front side 111 of the main-body 110 is further formed with a recess 116. The support block 121 leans against the front side 111 in parallel, and the extension block 122 is located in the recess 116.

The support block 121 has a narrow slot-hole 123, which is in parallel with a moving direction of the support block 121. The main-body 110 further includes a guiding portion 117 and a columnar pin seat 118. The guiding portion 117 protrudes from the front side 111 and provides a guiding surface 119. The guiding surface 119 is in parallel with the moving direction of the support block 121, and a bottom edge of the support block 121 leans against the guiding surface 119. The pin seat 118 protrudes from the front side 111, and is inserted in the narrow slot-hole 123 of the support block 121, so as to guide the support block 121 to move between the supporting position S and the receiving position R. Furthermore, the holder 100 further includes a pin 150, which is inserted in the pin seat 118 through the narrow slot-hole 123, thereby preventing the support block 121 from departing from the front side 111. The support block 121 further includes a protruding holding portion 124, for being held by a user to move the moving-arm 120. The movable moving-arm 110 may match add-on cards 200 with different widths, so that the holder 100 has preferred compatibility.

As shown in FIG. 2, FIG. 3, FIG. 8 and FIG. 9, the fixed metal piece 130 is disposed on the main-body 110, and is electrically grounded. A part of the fixed metal piece 130 extends to a location between the support block 121 and the front side 111, and surrounds the pin seat 118. A part of the moving metal piece 140 is disposed on the support block 121, and located between the support block 121 and the front side 111 for contacting with the fixed metal piece 130. The other part of the moving metal piece 140 extends to the extension block 122, and is bent at the edge of the extension block, so that at least a part of the moving metal piece 140 is exposed corresponding to the front side 111.

As shown in FIG. 1, FIG. 6 and FIG. 7, when it intends to mount the add-on card 200 on the main circuit board 300 in parallel, the moving-arm 120 is moved to the supporting position S. At this time, the edge 200a of the add-on card 200 leans against the supporting surface 115 of the support portion 114 and the upper edge 121a of the support block 121, and the moving metal piece 140 exposed on the extension block 122 contacts with the grounding element 210 of the add-on card 200. The moving metal piece 140 constantly contacts with the fixed metal piece 130, and the fixed metal piece 130 is electrically grounded, so that the grounding element 210 of the add-on card 200 is electrically grounded through the fixed metal piece 130 and the moving metal piece 140 continuously.

The main-body 110 and the moving-arm 120 will not interfere with the disposition of the interface slot 310, and a low-profile card may till be inserted in the interface slot 310. In a specific example, the expansion slot is a memory slot, and the circuit card is a DRAM memory module. If the gap between the extension block 122 and the main circuit board 300 is greater than the height of the memory module, the main-body 110 and the moving-arm 120 will not interfere with the disposition of the memory module.

Figure 8:
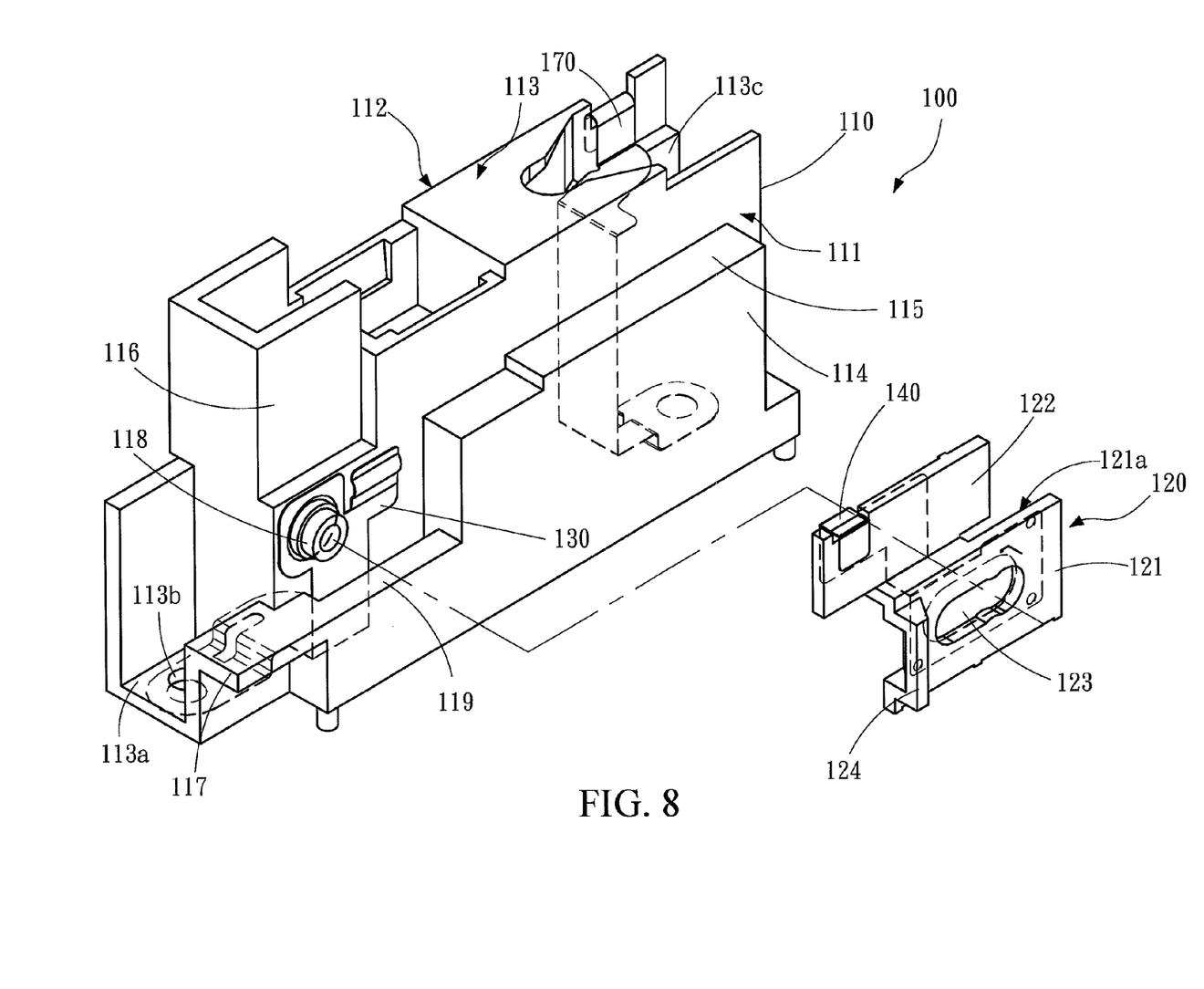
FIG. 8 is an exploded view of some elements of the holder according to an embodiment.
Figure 9:
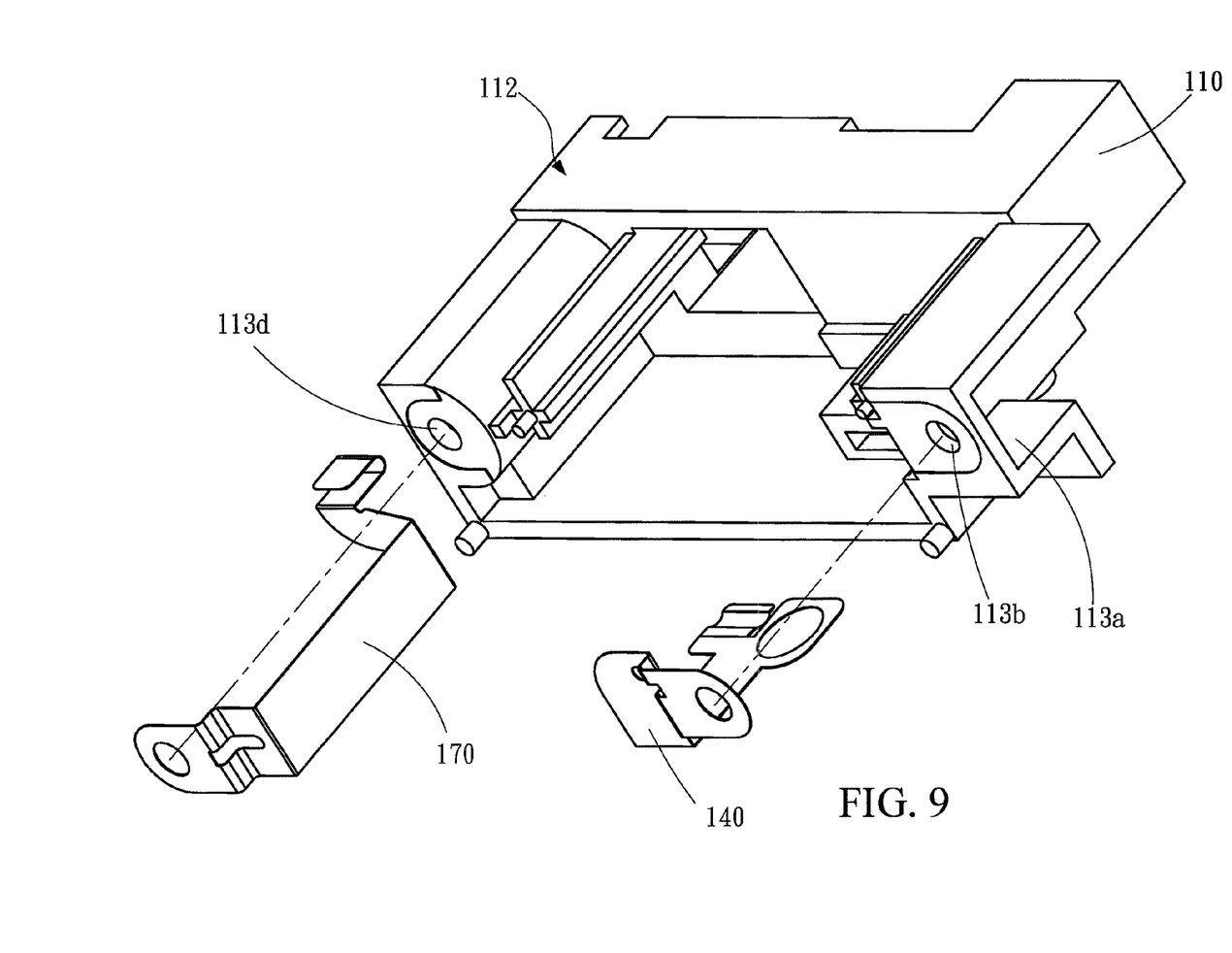
FIG. 9 is an exploded view of some elements of the holder according to the embodiment.

As shown in FIG. 8 and FIG. 9, the main-body 110 further includes a first recession 113a recessed in the top side 113 of the main-body 110, and a bottom of the first recession 113a has a first through-hole 113b. The fixed metal piece 130 extends to a bottom surface of the main-body 110, and surrounds the first through-hole 113b. The first through-hole 113b is used for a metal screw to pass through, so as to contact with the fixed metal piece 130, and connect a grounding connection pad of the main circuit board 300 to be electrically grounded.

The main-body further includes a second recession 113c recessed in the top side 113 of the main-body 110, and a bottom of the second recession 113c has a second through-hole 113d. The holder 100 further includes an auxiliary grounding metal piece 170, which has a part extending to the bottom surface of the main-body 110 and surrounding the second through-hole 113d, and the other part extending to a back side of the main-body 110. The second through-hole 113d is used for a metal screw to pass through, so as to contact the auxiliary grounding metal piece 170, and connect a grounding connection point of the main circuit board 300 to be electrically grounded. The back side of the main-body 110 may be contacted with by an edge 200a of another add-on card 200, so that a grounding element 210 of the other add-on card 200 is connected to the auxiliary grounding metal piece 170 to be electrically grounded.

In the holder 100 of this disclosure, the extension block 122 of the moving-arm 120 may keep a gap with the main circuit board 300, so that a part of the interface slot 310 may be disposed between the extension block 122 and the main circuit board 300, thereby preventing the holder 100 from interfering with the interface slot 310. At the same time, the movable moving-arm 120 may be matched with add-on cards 200 of different widths, so that the holder 100 has preferred compatibility.

While this disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A holder for supporting an add-on card on a main circuit board, and electrically grounding the add-on card, wherein a grounding element is disposed at an edge of the add-on card, the holder comprising:
   a main-body, disposed on the main circuit board, wherein the main-body comprises a front side, a rear side, and a top side; a support portion protrudes from the front side; and the support portion provides a supporting surface for supporting the edge of the add-on card;
   a moving-arm, comprising a support block and an extension block, wherein the extension block is connected to the support block; the support block is disposed on the front side of the main-body in a movable manner; an upper edge of the support block and the supporting surface are arranged in the same plane for supporting the edge of the add-on card; and the moving-arm moves to make the extension block protrude from the main-body with a gap existing between the extension block and the main circuit-board;
   a fixed metal piece, disposed on the main-body and electrically grounded, wherein a part of the fixed metal piece extends to a location between the support block and the front side; and
   a moving metal piece, having a part disposed on the support block and located between the support block and the front side for contacting with the fixed metal piece, and the other part extending to the extension block, so that at least a part of the moving metal piece is exposed corresponding to the front side.

2. The holder as claimed in claim 1, wherein the support block and the extension block are respectively sheet bodies, in parallel with each other without being located in the same plane.

3. The holder as claimed in claim 2, wherein the front side of the main-body is formed with a recess, the support block leans against the front side in parallel, and the extension block is located in the recess.

4. The holder as claimed in claim 3, wherein:
   the support block comprises a narrow slot-hole in parallel with a moving direction of the support block; and
   the main-body further comprises:
      a guiding portion, protruding from the front side, and providing a guiding surface in parallel with the moving direction of the support block, wherein a bottom edge of the support block leans against the guiding surface; and
      a columnar pin seat, protruding from the front side, and inserted in the narrow slot-hole.

5. The holder as claimed in claim 4, further comprising a pin, inserted in the pin seat through the narrow slot, for preventing the support block from departing from the front side.

6. The holder as claimed in claim 5, wherein the support block further comprises a protruded holding portion.

7. The holder as claimed in claim 1, wherein a first recession is recessed in the top side of the main-body, a first through-hole is formed on a bottom of the first recession, and the fixed metal piece extends to a bottom surface of the main-body and surrounds the first through-hole.

8. The holder as claimed in claim 1, wherein a second recession is recessed in the top side of the main-body, a second through-hole is formed on a bottom of the second recession, and the holder further comprises an auxiliary grounding metal piece, having a part extending to the second recession and surrounding the second through-hole and the other part extending to a back side of the main-body.

9. A circuit board assembly, comprising:
   a main circuit board;
   an interface slot, disposed on the main circuit board;
   a main-body, disposed on the main circuit board, wherein the main-body comprises a front side, a rear side, and a top side; a support portion protrudes from the front side; and the support portion provides a supporting surface;
   a moving-arm, comprising a support block and an extension block, wherein the extension block is connected to the support block; the support block is disposed on the front side of the main-body movable manner; an upper edge of the support block is located in the same plane with the supporting surface; and the moving-arm moves to make the extension block protrude from the main-body and be located above the interface slot;
   a fixed metal piece, disposed on the main-body and electrically grounded, wherein a part of the fixed metal piece extends to a location between the support block and the front side; and
   a moving metal piece, having a part disposed on the support block and located between the support block and the front side for contacting with the fixed metal piece, and the other part extending to the extension block, so that at least a part of the moving metal piece is exposed corresponding to the front side.

10. The circuit board assembly as claimed in claim 9, wherein the support block and the extension block are respectively sheet bodies, in parallel with each other without being located in the same plane.

11. The circuit board assembly as claimed in claim 10, wherein the front side of the main-body is formed with a recess, the support block leans against the front side in parallel, and the extension block is located in the recess.

12. The circuit board assembly as claimed in claim 11, wherein:
   the support block comprises a narrow slot-hole in parallel with a moving direction of the support block; and
   the main-body further comprises:
      a guiding portion, protruding from the front side, and providing a guiding surface in parallel with the moving direction of the support block, wherein a bottom edge of the support block leans against the guiding surface; and a columnar pin seat, protruding from the front side, and inserted in the narrow slot.

13. The circuit board assembly as claimed in claim 12, further comprising a pin, inserted in the pin seat through the narrow slot-hole, for preventing the support block from departing from the front side.

14. The circuit board assembly as claimed in claim 9, wherein a first recession is recessed in the top side of the main-body, a first through-hole is formed on a bottom of the first recession, and the fixed metal piece extends to a bottom surface of the main-body, and surrounds the first through-hole.

15. The circuit board assembly as claimed in claim 9, wherein a second recession is recessed in the top side of the main-body, a second through-hole is formed on a bottom of the second recession, and the holder further comprises an auxiliary grounding metal piece, having a part extending to a bottom surface of the main-body and surrounding the second through-hole, and the other part extending to a back side of the main-body.

\* \* \* \* \*